(12) United States Patent
Lee (10) Patent No.: US 7,718,323 B2
(45) Date of Patent: May 18, 2010

(54) OPTICAL PROXIMITY CORRECTION MASK PATTERN

(75) Inventor: Jun-Seok Lee, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 467 days.

(21) Appl. No.: 11/833,582

(22) Filed: Aug. 3, 2007

(65) Prior Publication Data
US 2008/0032211 A1    Feb. 7, 2008

(30) Foreign Application Priority Data
Aug. 7, 2006    (KR) .................. 10-2006-0074335

(51) Int. Cl.
*G03F 1/00* (2006.01)
(52) U.S. Cl. ...................................... 430/5
(58) Field of Classification Search ............... 430/5, 430/22; 716/11, 19, 20, 21
See application file for complete search history.

(56) References Cited

U.S. PATENT DOCUMENTS

| 5,242,770 A * | 9/1993 | Chen et al. ............... 430/5 |
| 2002/0142597 A1 * | 10/2002 | Park et al. ............... 438/689 |

* cited by examiner

*Primary Examiner*—Stephen Rosasco
(74) *Attorney, Agent, or Firm*—Sherr & Vaughn, PLLC (57) ABSTRACT

An optical proximity correction (OPC) mask pattern used in a layout for a photolithography process. An OPC mask pattern may include a first mask pattern for an active region and a second mask pattern for a gate pattern. The second mask pattern may have a plurality of micro patterns stacked at the end, which avoids unintended overlapping of the first mask pattern and the second mask pattern.

20 Claims, 7 Drawing Sheets

OPTICAL PROXIMITY CORRECTION MASK PATTERN

This application claims the benefit under 35 U.S.C. 119 to Korean Patent Application No. 10-2006-0074335, filed on Aug. 7, 2006, which is hereby incorporated by reference in its entirety.

BACKGROUND

In many semiconductor applications, semiconductor devices have relatively high integration (e.g. the size of the semiconductor devices may be relatively small and an arrangement density of the semiconductor device is relatively high). Accordingly, critical dimensions of a mask pattern corresponding to relatively small semiconductor device may approach the resolution limit of an optical exposure apparatus.

A method of optical proximity correction (OPC) may be used to overcome the difficulties in photolithography processes. A method of OPC may include at least one of the following: Manufacturing a mask pattern for a test using a test pattern representing all patterns in a design. Transferring a pattern to a semiconductor substrate using the mask pattern. Performing etching to form a semiconductor pattern for a test on the semiconductor substrate.

An ArF light source used in a photolithography process may have a wavelength of approximately 193 nm, which may cause complications. An ArF light source may have a relatively small polymer adsorption force, which may result in a relatively low resistance to plasma. The reactivity to an etchant may be relatively high to an ArF light source, which may result in a relatively low etch margin, which may compromise the uniformity in critical dimension of the semiconductor substrate.

In order to overcome complications with ArF light sources, etching methods using trimming technology may be used to control etching time when a critical dimension in a design is larger than a desired real dimension in forming a pattern. However, when trimming technology is used, it may be relatively difficult to control etching time. As a result, differences between critical dimensions may easily occur when forming micro patterns. Accordingly, it may still be difficult to have a reasonably repeatable process margin when using optical proximity correction.

Achieving adequate micro line width resolution may be difficult based on a micro-scale reduction of a design line width. Micro-scale reduction of a pattern may be complicated because the resolution of the cell pattern is affected by an optical proximity effect, where a line width of a line end is diminished. As a result, a margin of a line end of a mask pattern for a gate pattern with respect to a mask pattern for an active region may not be accurately formed, which my compromise cell operation characteristics.

Figure 1A:
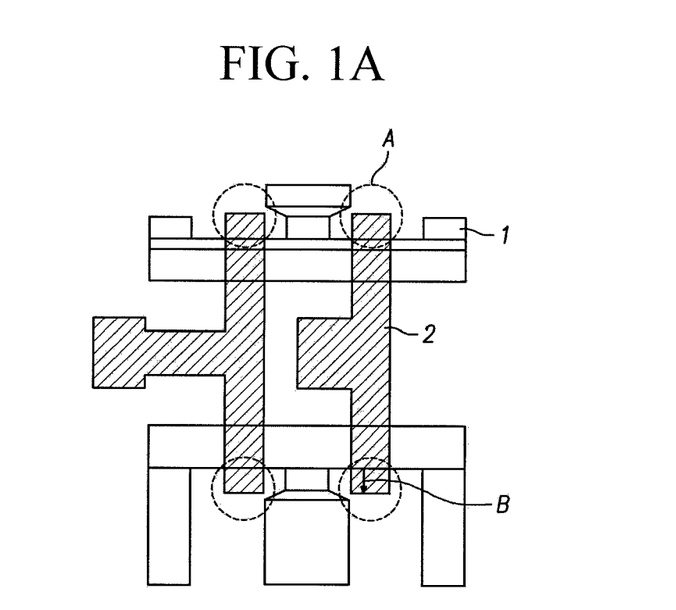
FIGS. 1A to 1C illustrate layouts of mask patterns.
Figure 1B:
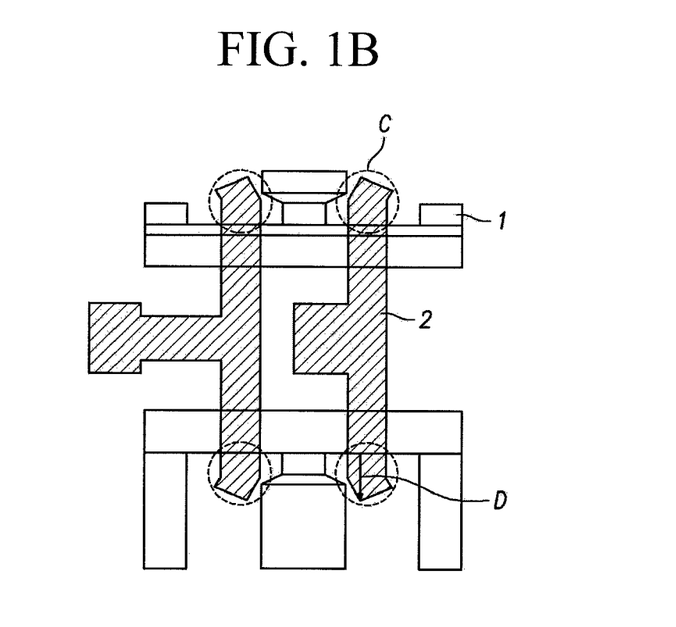

For example, if a cell area is less than approximately 130 nm, it may be difficult to form a line end with appropriate dimensions. Example FIG. 1A illustrates line ends A and B for mask pattern 2 for a gate pattern in an active region that are straight with respect to mask pattern 1 for an active region. Example FIG. 1B illustrates line ends C and D of mask pattern 2 for a gate pattern bent with respect to mask pattern 1 for an active region. Line ends C, and D that are bent may be relatively difficult to form when a cell area is less than approximately 130 nm.

Figure 1C:
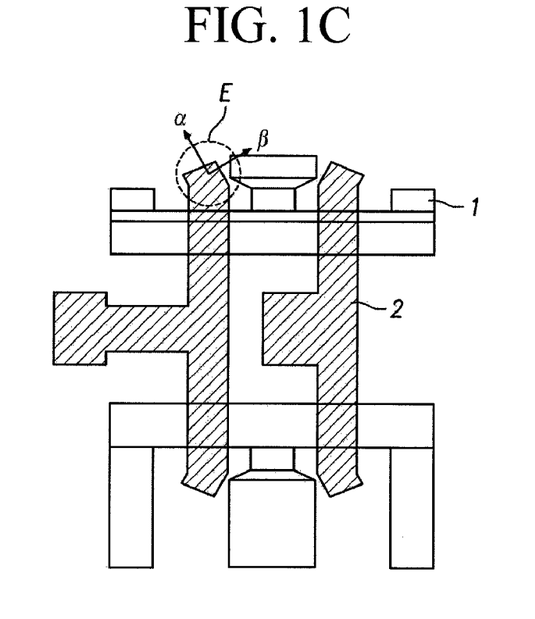
Figure 2A:
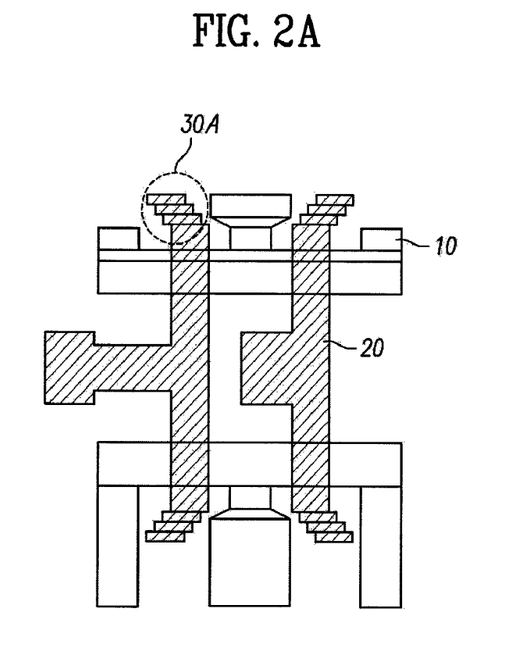
FIGS. 2A through 2D and 3A through 3D illustrate layouts of a mask pattern, according to embodiments.
Figure 2B:
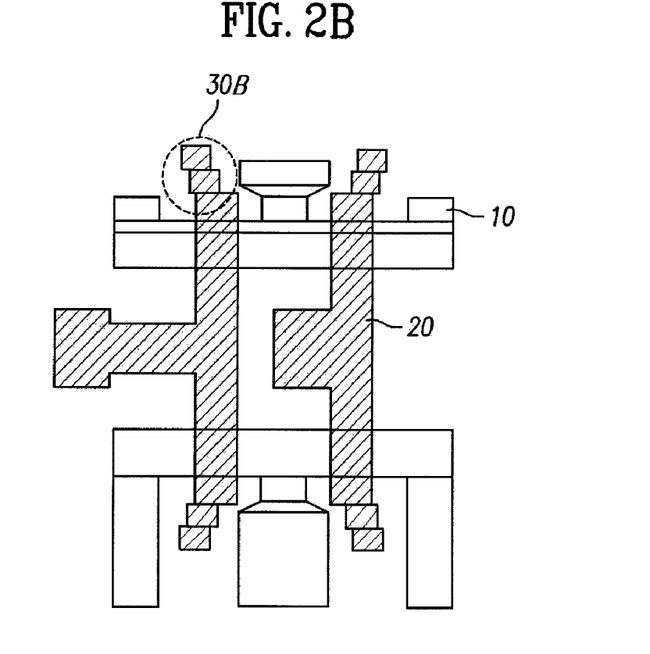
Figure 2C:
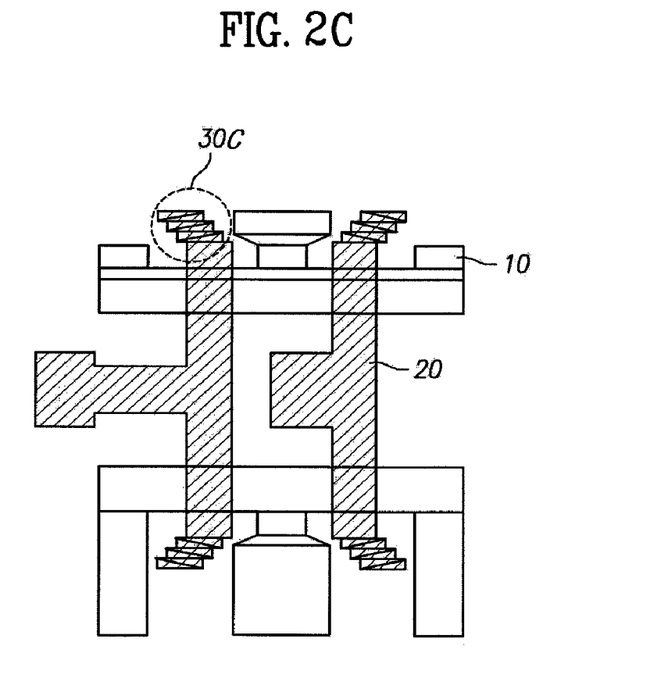
Figure 2D:
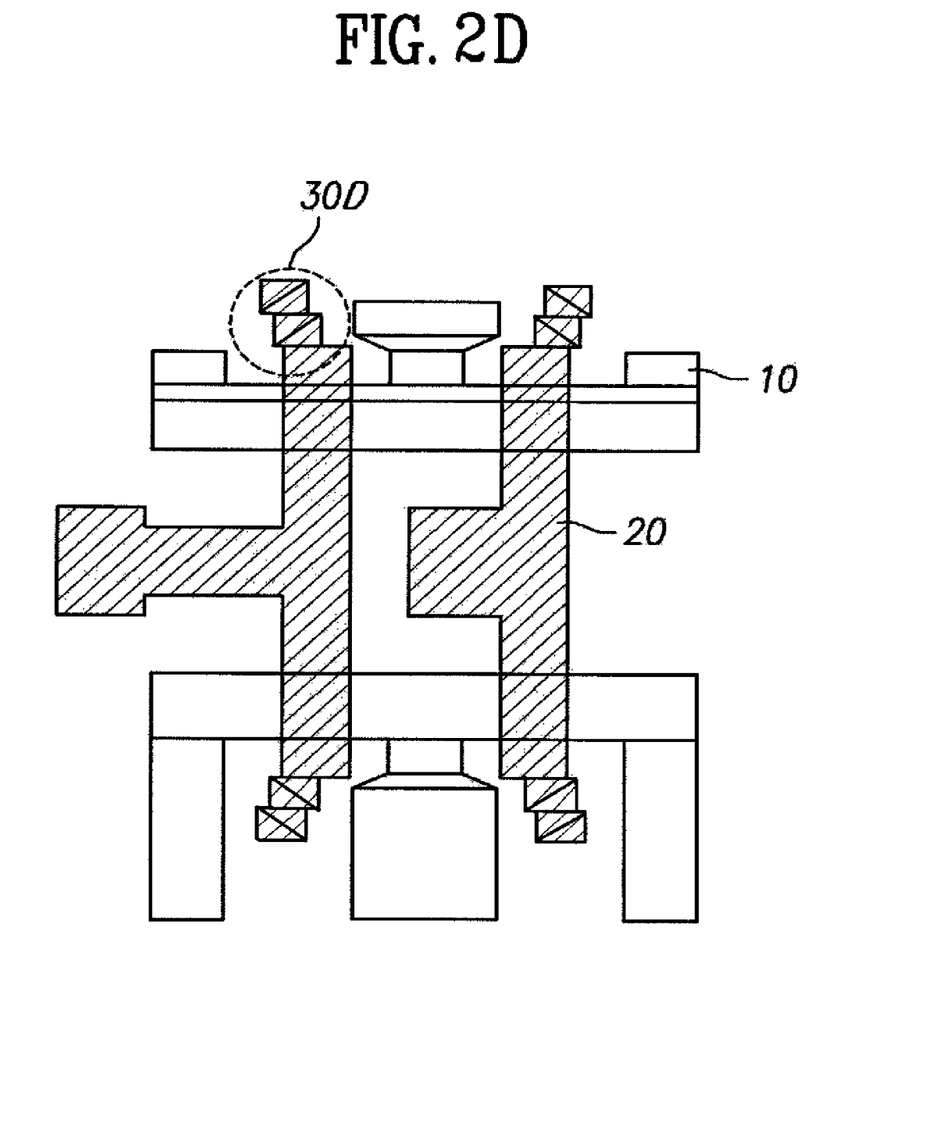
Figure 3A:
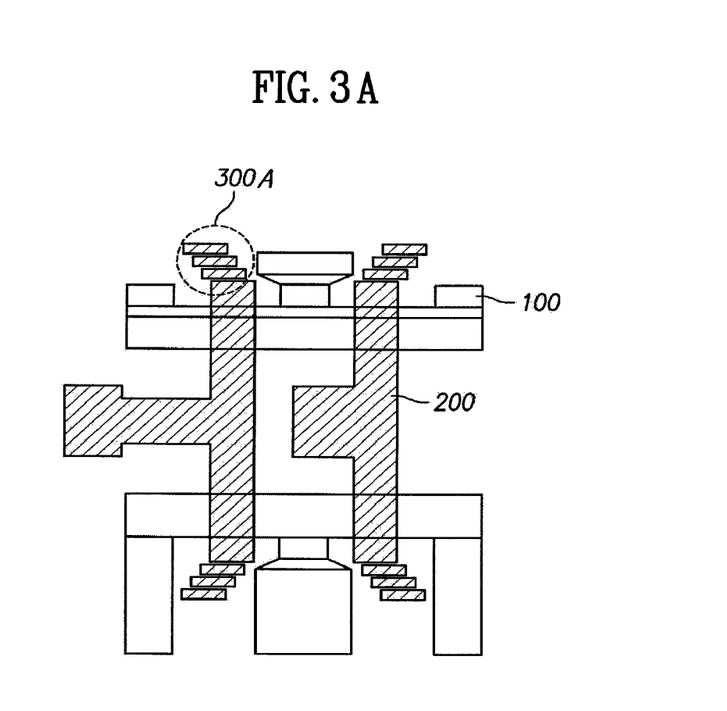
Figure 3B:
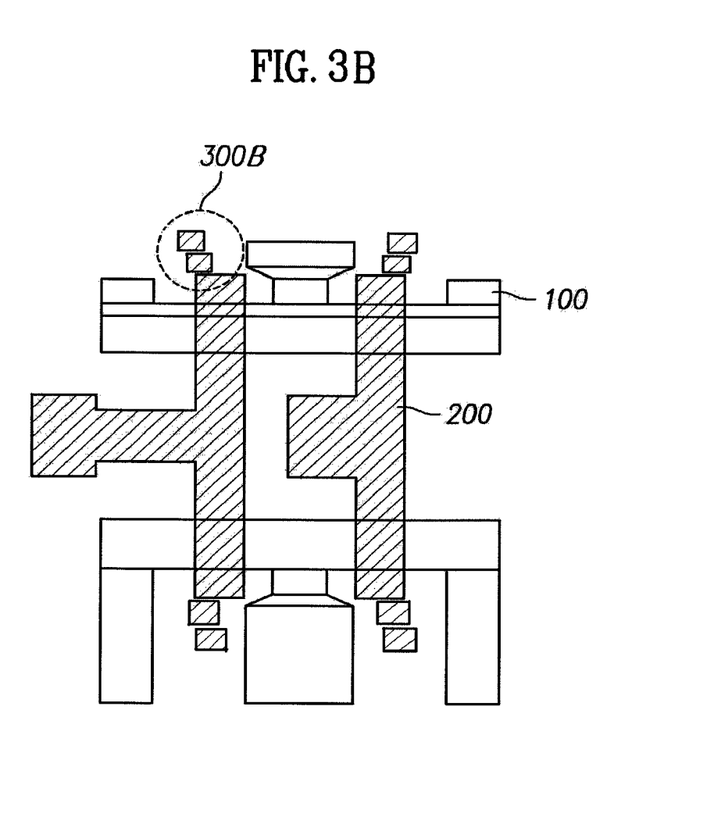
Figure 3C:
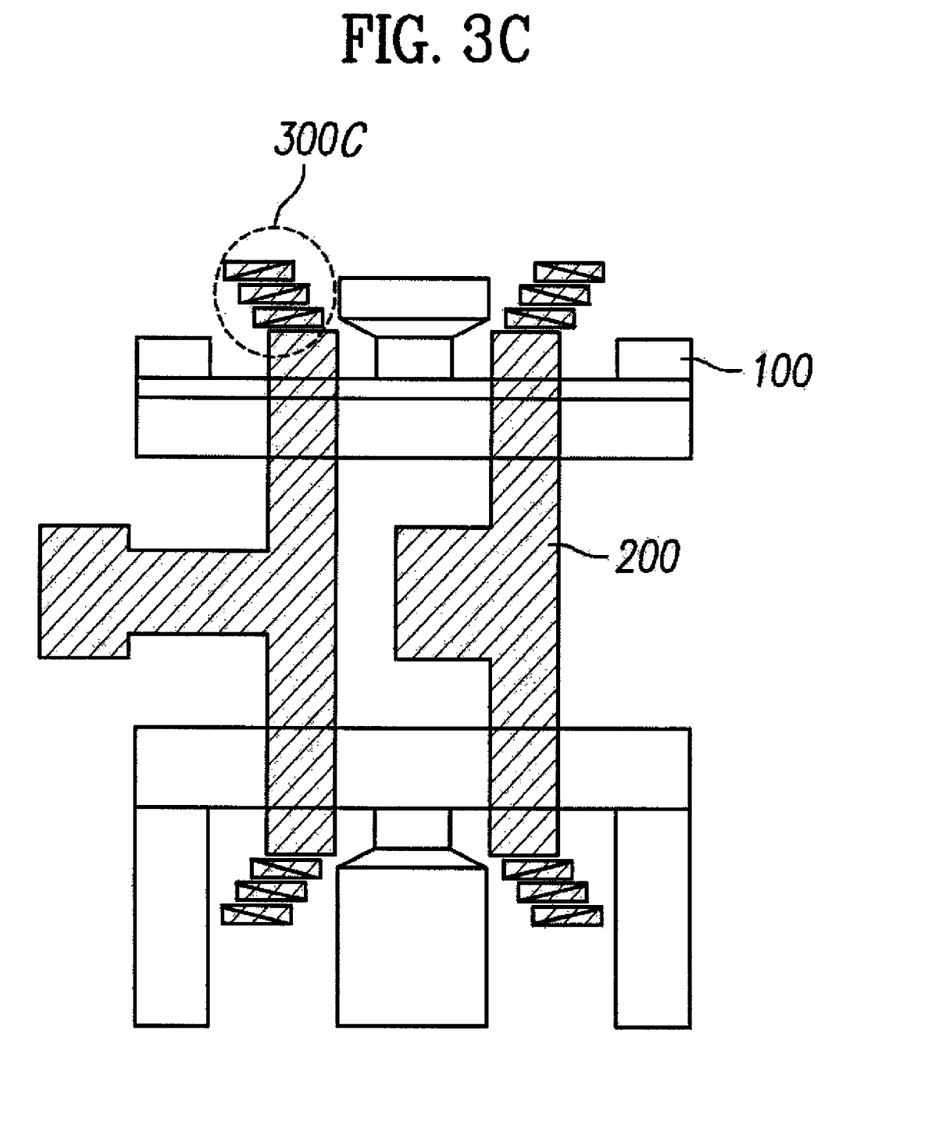
Figure 3D:
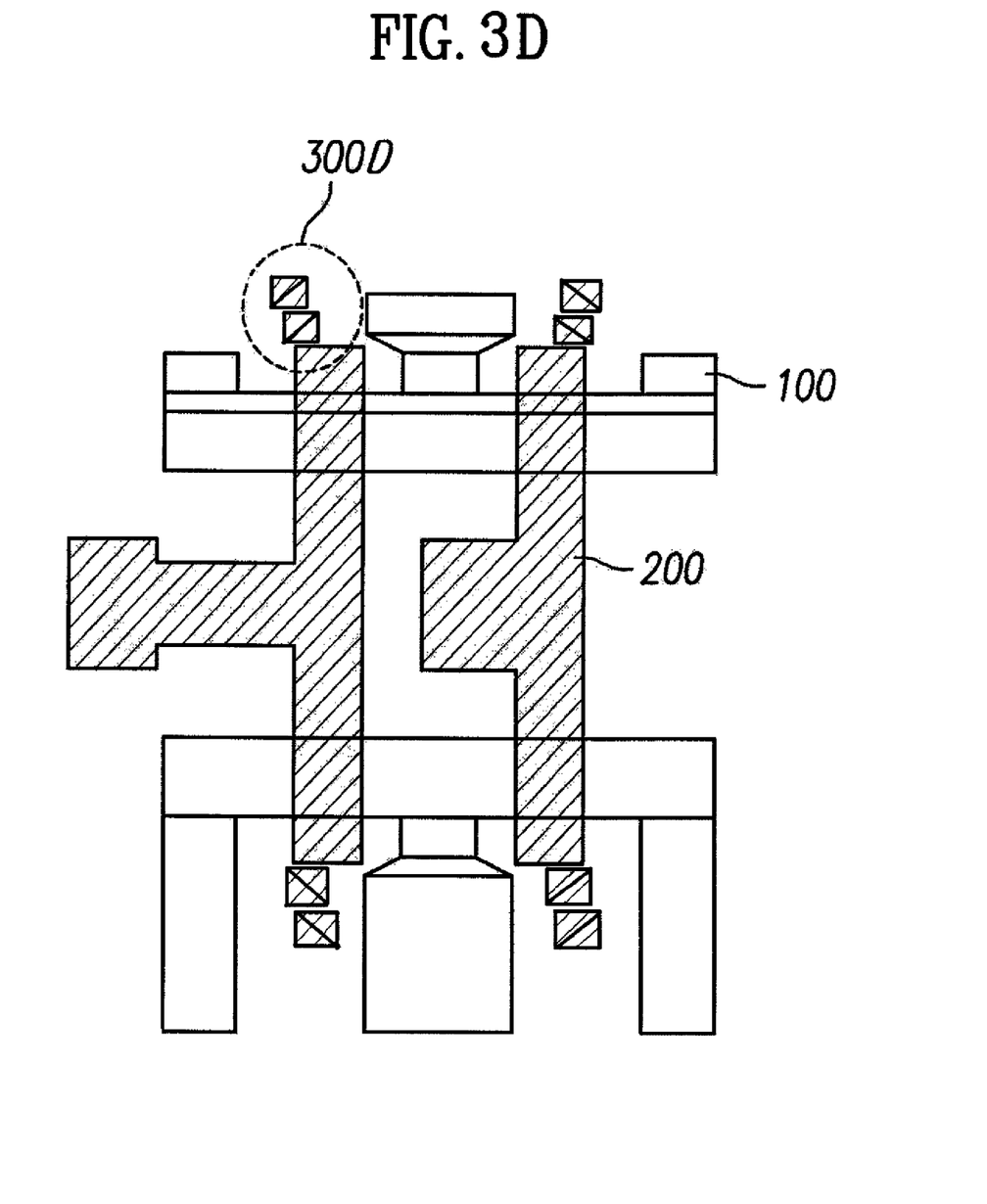

However, when the spatial margin is not sufficient to bend line ends as illustrated in example FIG. 1C, the line ends of mask pattern 2 for a gate pattern may be pointed like a spear with respect to mask pattern 1 for an active region. As a result, the edge length in the direction a may be similar to the edge length in the direction β, which may result in accelerated line-end shortening (LES). Accordingly, it may be difficult to accomplish a desired image pattern, even though an OPC process is performed on line ends of mask pattern 2 for a gate pattern.

SUMMARY

Embodiments relate to an optical proximity correction (OPC) mask pattern which may maximize a margin of an image pattern. In embodiments, an OPC mask pattern may substantially prevent line-end shortening (LES), which may maximize the margin of an image pattern. Performance of a semiconductor device may be maximized using an OPC mask pattern in accordance with embodiments that maximizes a margin of an image pattern.

In embodiments, an OPC mask pattern may be used in a layout for a photolithography process. In accordance with embodiments, an OPC mask may include a first mask pattern for an active region and a second mask pattern for a gate pattern. A second mask pattern may have a plurality of micro patterns stacked at the end, which may avoid unintended overlapping of the first mask pattern and the second mask pattern, in accordance with embodiments.

In embodiments, micro patterns are formed in the shape of rectangles and the rectangular patterns are arranged in a step formation. In embodiments, rectangular patterns may be arranged apart from each other by a predetermined gap. In embodiments, an OPC pattern may be formed using at least one of cyclic olefin, a polymer of derivatives of the cyclic olefin, cyclic acetylene, a polymer of derivatives of the cyclic acetylene, a polymer compound made through the polymerization of norbonene monomer, and/or an aliphatic cyclic polymer compound.

DRAWINGS

Example

Example

DESCRIPTION

As illustrated in example FIG. 2A through 2D a layout of mask patterns includes first mask pattern 10 for an active region and a second mask pattern 20 for a gate pattern, in accordance with embodiments. In embodiments, first mask pattern 10 may be a mask pattern to transfer a pattern to a semiconductor substrate and perform etching in a photolithography process, to form an active region in a semiconductor substrate. In embodiments, second mask pattern 20 may be a mask pattern to transfer a pattern to a semiconductor substrate and perform etching in a photolithography process, to form a gate pattern in a semiconductor substrate.

First mask pattern 10 and the second mask pattern 20 may partially overlap each other. In embodiments, the ends of overlapping portions of second mask pattern 20 with respect to first mask pattern 10 are successively arranged. In embodiments, end overlapping portions of second mask pattern 20 are not connected with each other in a curved pattern. As illustrated in example FIG. 2A, a plurality of micro patterns at the end 30A of the second mask pattern 20 may be formed to have a rectangular shape, in accordance with one embodiment. As illustrated in example FIG. 2B, a plurality of micro patterns at the end 30B of the second mask pattern 20 may be formed to have a square shape, in accordance with another embodiment. As illustrated in example FIG. 2C or FIG. 2D, a plurality of micro patterns at the end 30C or 30D of the second mask pattern 20 may be formed to have a triangle shape, in accordance with still another embodiment. In embodiments, end 30A of second mask pattern 20 may be formed using a plurality of micro rectangular patterns having dimensions of approximately 130 nm by 20 nm. However, those skilled in the art would appreciate other dimensions. Micro rectangular patterns may be arranged in a step formation, which may increase the area of second mask pattern 20, in accordance with embodiments. Using a step formation, it may be possible to adjust the tilt angle of rectangular patterns at the end 30A of the second mask pattern 20, depending upon a spatial margin in which overlapping between the rectangular patterns and first mask pattern 10 is avoided.

Second mask pattern 20 may be made of a polymer compound, in accordance with embodiments. In embodiments, second mask pattern 20 may be formed to include an aromatic or aliphatic cyclic polymer compound. In embodiments, an aromatic or aliphatic cyclic polymer compound may have a relatively large carbon content. In embodiments, second mask pattern 20 may include at least one of cyclic olefin, a polymer derivatives of cyclic olefin, cyclic acetylene, a polymer derivatives of cyclic acetylene, and/or a polymer made through polymerization of norbonene monomer.

When the spatial margin is relatively large, the end 30A, 30B, 30C or 30D of second mask pattern 20 for the gate pattern may need to be bent in order to extend the length of end 30A, 30B, 30C or 30D, according to embodiments. To extend the length of end 30A, 30B, 30C or 30D by bending end 30A, 30B, 30C or 30D, a step-shaped formation may be used. A step-shaped formation may allow for adequate control during formation of a bent type pattern without causing complications, in accordance with embodiments.

Example FIG. 3A through FIG. 3D illustrate a layout illustrating a mask pattern, in accordance with embodiments. A layout includes first mask pattern 100 for an active region and second mask pattern 200 for a gate pattern. First mask pattern 100 may be used to transfer a pattern to a semiconductor substrate and perform etching in a photolithography process, such that an active region is formed in the semiconductor substrate. Second mask pattern 200 may be used to transfer a pattern to a semiconductor substrate and perform etching in a photolithography process, such that a gate pattern is formed in the semiconductor substrate.

First mask pattern 100 and second mask pattern 200 may partially overlap each other. Ends 300A, 300B, 300C or 300D of second mask pattern 200 are not connected with first mask pattern 100 and may be curved. As illustrated in example FIG. 3A, ends 300A include a plurality of rectangular micro patterns having a rectangular shape. As illustrated in example FIG. 3B, ends 300B include a plurality of square micro patterns having a square shape. As illustrated in example FIG. 3C, ends 300C include a plurality of rectangular micro patterns having a triangle shape. As illustrated in example FIG. 3D, ends 300D include a plurality of square micro patterns having a triangle shape. In embodiments, each of ends 300A may have dimensions of 130 nm by 20 nm. However, those skilled in the art would appreciate other dimensions. In embodiments, micro patterns of ends 300A, 300B, 300C or 300D may be arranged in a dispersion fashion with micro patterns spaced apart from each other by a predetermined gap. In embodiments, rectangular micro patterns of ends 300A may be arranged in a step formation, such that micro rectangular patterns constitute a bent type pattern, which may maximize the area of second mask pattern 200.

Second mask pattern 200 may be made of a polymer compound, in accordance with embodiments. In embodiments, second mask pattern 200 may be formed to include an aromatic or aliphatic cyclic polymer compound. In embodiments, an aromatic or aliphatic cyclic polymer compound may have a relatively large carbon content. In embodiments, second mask pattern 200 may include at least one of cyclic olefin, a polymer derivatives of cyclic olefin, cyclic acetylene, a polymer derivatives of cyclic acetylene, and/or a polymer made through polymerization of norbonene monomer.

With first mask pattern 100 and second mask pattern 200, rectangular micro patterns may be arranged at ends 300A of second mask pattern 200 in the dispersion fashion in which the rectangular micro patterns are spaced apart by a predetermined gap, in accordance with embodiments. In embodiments, ends 300A, 300B, 300C or 300D may maximize an OPC effect and correction of line end may be accomplished, with the margin of line end repeatable. In embodiments, ends 300A, 300B, 300C or 300D may allow for a maximum increase the length of line end, which may improve production rate of semiconductor devices.

In mask patterns illustrated in example FIGS. 2A through 2D and 3A through 3D, according to embodiments, a plurality of micro patterns may be stacked at ends 30A through 30D or ends 300A through 30D of second mask pattern 20 or second mask pattern 200 in order to avoid the overlapping with first mask pattern 10 or first mask pattern 100. Although micro patterns illustrated in example FIGS. 2A through 2D and 3A through 3D are illustrated as being in the shape of a square, a rectangle or triangle, those of ordinary skill in the art would appreciate other shapes, in accordance with embodiments. In embodiments, micro patterns arranged ends of a mask pattern may be in a step fashion and/or a dispersion fashion, which may maximize an OPC effect with respect to the mask pattern to accomplishing correction of line ends and effectively secure a margin of line ends.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. An apparatus comprising:
   a first mask pattern for an active region of a semiconductor device; and
   a second mask pattern for a gate region of a semiconductor device, wherein:
   the second mask comprises ends which are bent, and
   said ends that are bent comprise at least two elements that are arranged in a step formation.

2. The apparatus of claim 1, wherein said at least two elements are at least one of contiguous and overlapping to each other.

3. The apparatus of claim 1, wherein said at least two elements are spaced apart from each other.

4. The apparatus of claim 1, wherein each of said at least two elements has a rectangular shape.

5. The apparatus of claim 4, wherein at least one of said at least two elements has dimensions of approximately 130 nm by 20 nm.

6. The apparatus of claim 1, wherein at least one of said at least two elements has a square shape.

7. The apparatus of claim 1, wherein at least one of said at least two elements has a triangle shape.

8. The apparatus of claim 1, wherein at least one of the first mask pattern and the second mask pattern is an optical proximity correction mask pattern for use in a photolithography process.

9. The apparatus of claim 1, wherein said second mask pattern comprises a polymer compound.

10. The apparatus of claim 1, wherein said second mask pattern comprises at least one of:
   an aromatic cyclic polymer compound;
   an aliphatic cyclic polymer compound;
   an aromatic polymer compound having a relatively large carbon content;
   an aliphatic cyclic polymer compound having a relatively large carbon content;
   cyclic olefin;
   a polymer derivatives of cyclic olefin;
   cyclic acetylene;
   a polymer derivatives of cyclic acetylene; and
   a polymer made by polymerization of norbonene monomer.

11. A method comprising:
   forming an active region of a semiconductor device using a first mask pattern; and
   forming a gate region of the semiconductor device using a second mask pattern, wherein:
      the second mask comprises ends which are bent, and
      said ends that are bent comprise at least two elements that are arranged in a step formation.

12. The method of claim 11, wherein said at least two elements are at least one of contiguous and overlapping to each other.

13. The method of claim 11, wherein said at least two elements are spaced apart from each other.

14. The method of claim 11, wherein each of said at least two elements has a rectangular shape.

15. The method of claim 14, wherein at least one of said at least two elements has dimensions of approximately 130 nm by 20 nm.

16. The method of claim 11, wherein at least one of said at least two elements has a square shape.

17. The method of claim 11, wherein at least one of said at least two elements has a triangle shape.

18. The method of claim 11, wherein at least one of the first mask pattern and the second mask pattern is an optical proximity correction mask pattern for use in a photolithography process.

19. The method of claim 11, wherein said second mask pattern comprises a polymer compound.

20. The method of claim 11, wherein said second mask pattern comprises at least one of:
   an aromatic cyclic polymer compound;
   an aliphatic cyclic polymer compound;
   an aromatic polymer compound having a relatively large carbon content;
   an aliphatic cyclic polymer compound having a relatively large carbon content;
   cyclic olefin;
   a polymer derivatives of cyclic olefin;
   cyclic acetylene;
   a polymer derivatives of cyclic acetylene; and
   a polymer made by polymerization of norbonene monomer.

* * * * *